United States Patent [19]
Tupuri et al.

[11] Patent Number: 5,892,373
[45] Date of Patent: Apr. 6, 1999

[54] DISTRIBUTED GATED CLOCK DRIVER

[75] Inventors: Raghuram S. Tupuri; Stephen C. Horne, both of Austin, Tex.

[73] Assignee: Advanced Micro Devices, Inc., Sunnyvale, Calif.

[21] Appl. No.: 790,393

[22] Filed: Jan. 29, 1997

[51] Int. Cl.[6] ................................................. H03K 19/096
[52] U.S. Cl. ................................. 326/97; 326/93; 327/297
[58] Field of Search .................................. 326/93, 96, 97, 326/83; 327/295, 296, 297

[56] References Cited

U.S. PATENT DOCUMENTS

| | | | |
|---|---|---|---|
| 5,008,563 | 4/1991 | Kenny et al. | 326/93 |
| 5,013,942 | 5/1991 | Nishimura et al. | 326/93 |
| 5,453,707 | 9/1995 | Hiratsuka et al. | 326/97 |
| 5,670,899 | 9/1997 | Kohdaka | 326/97 |
| 5,705,942 | 1/1998 | Ashuri | 326/93 |
| 5,760,609 | 6/1998 | Sharpe-Geisler | 326/93 |
| 5,760,610 | 6/1998 | Naffziger | 326/93 |

*Primary Examiner*—Michael Tokar
*Assistant Examiner*—Richard Roseen
*Attorney, Agent, or Firm*—Conley, Rose & Tayon, PC; B. Noel Kivlin

[57] ABSTRACT

A gated clock driver is configured to provide an enable signal and a gated clock signal at each of a plurality flip-flops. One of the p-channel transistors of the gated clock driver's NOR gate is distributed to each of the flip-flops or latches in the system. Additionally, an extra n-channel transistor is provided in the gated clock circuit to form an inverter with the nondistributed p-channel transistor. More particularly, the p-channel transistor that is driven by the system clock input is distributed to each of the flip-flops. Similarly, the enable input (at the output of the new inverter) is distributed to each of the flip-flops. Since the gated clock signal cannot be generated without the enable signal being high and the system clock being low, distributing enable and the p-channel transistor which receives the system clock as an input minimizes clock skew as compared to flip-flops with a completely shared clock gating clock.

10 Claims, 8 Drawing Sheets

5,892,373

DISTRIBUTED GATED CLOCK DRIVER

BACKGROUND OF THE INVENTION

1. Field of the Invention

The present invention relates to gated clock drivers and, more particularly, to a distributed gated clock driver having improved clock skew characteristics.

2. Description of the Relevant Art

Gated clock drivers are used in VLSI designs to selectively latch data into flip-flop or latch circuits. Such latches may, for example, be used to implement the registers coupled between stages in pipelined microprocessors. Pipelining involves partitioning a process with "n" steps into "n" hardware stages separated by memory elements called registers which hold intermediate results. There is one pipeline stage for each step in the process and the stages are connected in the same order that the steps are performed. By allowing each of the n stages to operate concurrently, the pipelined process can potentially operate at n times the rate of the non-pipelined process.

The gated clock drivers used to latch the data into the flip-flops may be implemented either as shared control logic across a bank of flip-flops or individually with each flip-flop forming the bank or data path. Since the data path typically requires 32-bits or more, 32 flip-flops or more are required. Accordingly, implementing the gated clock drivers in the data path flip-flops requires more chip area, which is frequently at a premium in high performance microprocessors.

FIGS. 1a and 1b—Flip-Flops with Shared and Distributed Clock Drivers

This is readily seen with respect to FIGS. 1a and 1b. FIG. 1a illustrates an exemplary bank of flip-flops 2a through 2n (collectively referred to as flip-flops or latches 2) sharing a gated clock driver 4. A clock input is provided along line 3 to clock driver 4. An enable input is provided via line 6. The gated clock is then distributed to each of the flip-flops or latches 2.

FIG. 1b, on the other hand, illustrates a bank of n flip-flops 6a through 6n (referred to collectively as flip-flops or latches 6), each having its own gated clock driver 8a through 8n (referred to collectively as clock drivers 8). Providing a clock driver 8 to each flip-flop or latch 6 obviously requires duplication of circuitry and hence occupies considerably more chip space than the implementation of FIG. 1a, though it is noted that the implementation in FIG. 1b is relatively faster than that illustrated in FIG. 1a. Nevertheless, because of the area advantages gained by sharing clock drivers, the implementation of FIG. 1a is often preferred.

FIG. 2 and FIG. 3—Shared Gated Clock Driver and NOR Gate

Turning now to FIG. 2, there is illustrated a gated clock driver as implemented in a shared system 90. Shared system 90 includes a shared clock driver 100 coupled to a plurality of flip-flops or latches (of which only one is illustrated, and referred to as flip-flop or latch 200). Shared clock driver 100 receives a clock signal ICLK and an enable signal EN into a latch circuit 103. The output of the latch circuit 103 is provided to an inverter 104. The inverted latched enable signal, XLEN, and the clock signal ICLK, are input into NOR gate 102.

NOR gate 102 is typically a standard NOR gate of the type well-known in the art and illustrated in FIG. 3. NOR gate 102 includes a pair of p-channel transistors in series 202, 204 and a pair of n-channel transistors 206, 208 in parallel. When both inputs XLEN and ICLK are low, both p-channel devices 202, 204 are conducting, while both n-channel devices 206, 208 are cut off, and the output XGICLK is high. When either or both inputs are high, one or both of the p-channel transistors 202, 204 will turn off and one or both of the n-channel transistors 206, 208 will turn on, leading to a low output at XGICLK.

Turning back to FIG. 2, the output of NOR gate 102 will be high whenever enable signal XLEN is low and the clock signal ICLK is low. The resulting output XGICLK of NOR gate 102 is provided to clock flip-flop 200. As is well-known in the art, flip-flop 200 includes transmission gates 106a and 106b, control inverters 108a and 108b coupled to receive as inputs the ICLK clock signal and the XGICLK clock signal, respectively, and a pair of hold circuits 110a, 110b. When enabled, the input D, for example, will be latched through to output Q of flip-flop 200. It is noted that while a D flip-flop is illustrated, various other kinds of latches and flip-flops are contemplated.

In addition, as noted above, in a typical system, the data path is 32 bits wide. Thus, there may be 32 flip-flops, such as flip-flop 200, to which the XGICLK common clock signal is provided. Providing a common clock driver signal, however, introduces clock skew because the gated clock must be routed across each flip-flop in the data path. Clock skew occurs when two clock signals travel along different paths with different delay times arriving at different latches at different times. While clock skew may be minimized by routing the gated clock signal across a low resistance (wide) interconnect, this method is undesirable because it occupies too much chip area.

SUMMARY OF THE INVENTION

Accordingly, there is provided a shared gated clock driver having components distributed across data path flip-flops to reduce clock skew. According to one embodiment of the present invention, a gated clock driver is configured to provide an enable signal and the gated clock signal at each of the flip-flops in the system. One of the p-channel transistors of the gated clock driver's NOR gate is distributed to each of the flip-flops or latches in the system. Additionally, an extra n-channel transistor is provided in the gated clock circuit to form an inverter with the nondistributed p-channel transistor. More particularly, the p-channel transistor that is driven by the system clock input is distributed to each of the flip-flops. The system clock in a microprocessor is normally distributed to all parts of the chip in a low-skew, controlled fashion. Similarly, the enable input (at the output of the new inverter) is distributed to each of the flip-flops. Since the gated clock signal cannot be generated without the enable signal being high and the system clock being low, distributing enable and the p-channel transistor which receives the system clock as an input reduces the skew of the gated clock relative to the system clock.

Broadly speaking, an embodiment of the present invention contemplates a gated clock driver, comprising an inverter configured to receive a first input signal and including a first n-channel transistor and a first p-channel transistor. A second n-channel transistor is coupled in parallel to a third n-channel transistor. A gate of the second n-channel transistor is coupled to receive a second input signal, and the third n-channel transistor is coupled to receive the first input signal. At least one second p-channel transistor has a source coupled to an output of the inverter, a gate coupled to receive the second input signal, and a drain coupled to a drain of the second n-channel transistor and a drain of the third n-channel transistor.

An embodiment of the present invention further contemplates a circuit, comprising a plurality of sequential logic circuits, each of which includes a sequential logic element and a clock element configured to receive an input enable signal and an input clock signal and further configured to provide an output clock signal to clock each of the sequential logic elements. Finally, the circuit includes a shared logic circuit coupled to receive a latch enable signal and the input clock signal, wherein the shared logic circuit is configured to provide the input enable signal to the clock element and is configured to generate the output clock signal with the clock element.

BRIEF DESCRIPTION OF THE DRAWINGS

A better understanding of the present invention can be obtained when the following detailed description of the invention is considered in conjunction with the following drawings, in which.

Figure 1A:
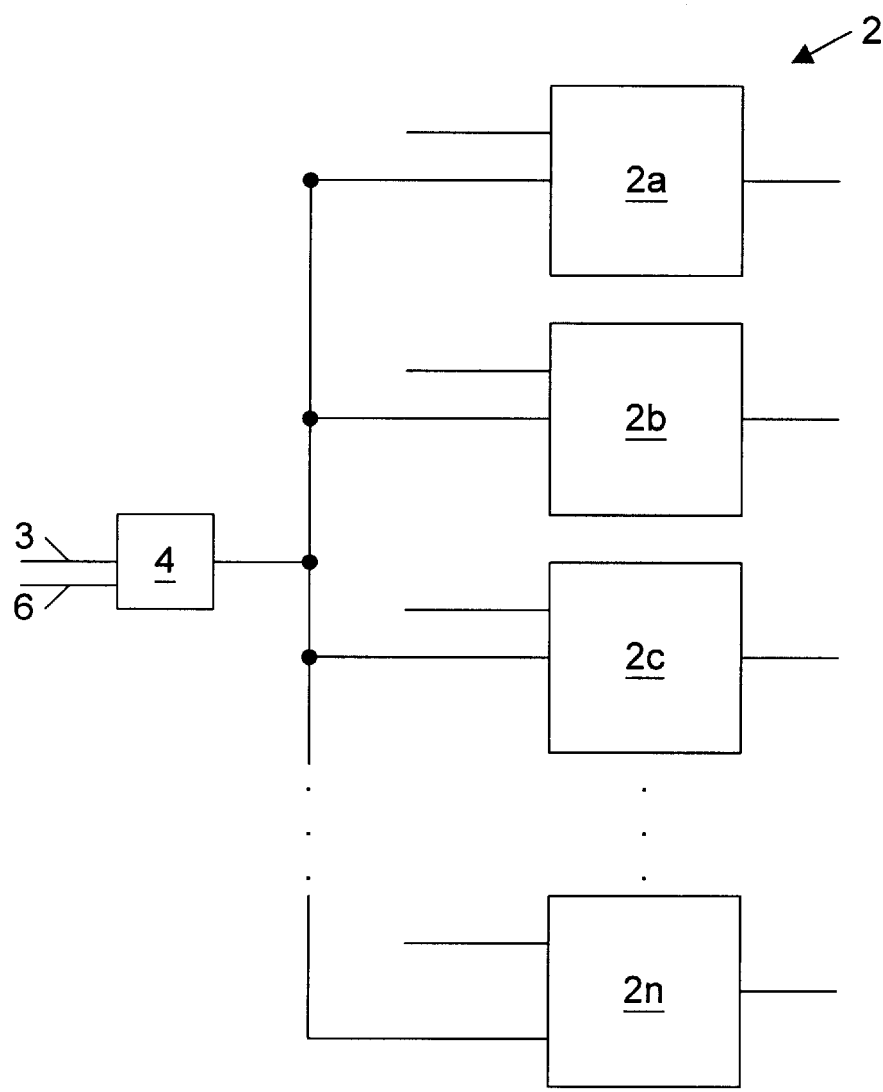
FIGS. 1a and 1b illustrate data path flip-flops having shared gated clock drivers and individual gated clock drivers, respectively.
Figure 1B:
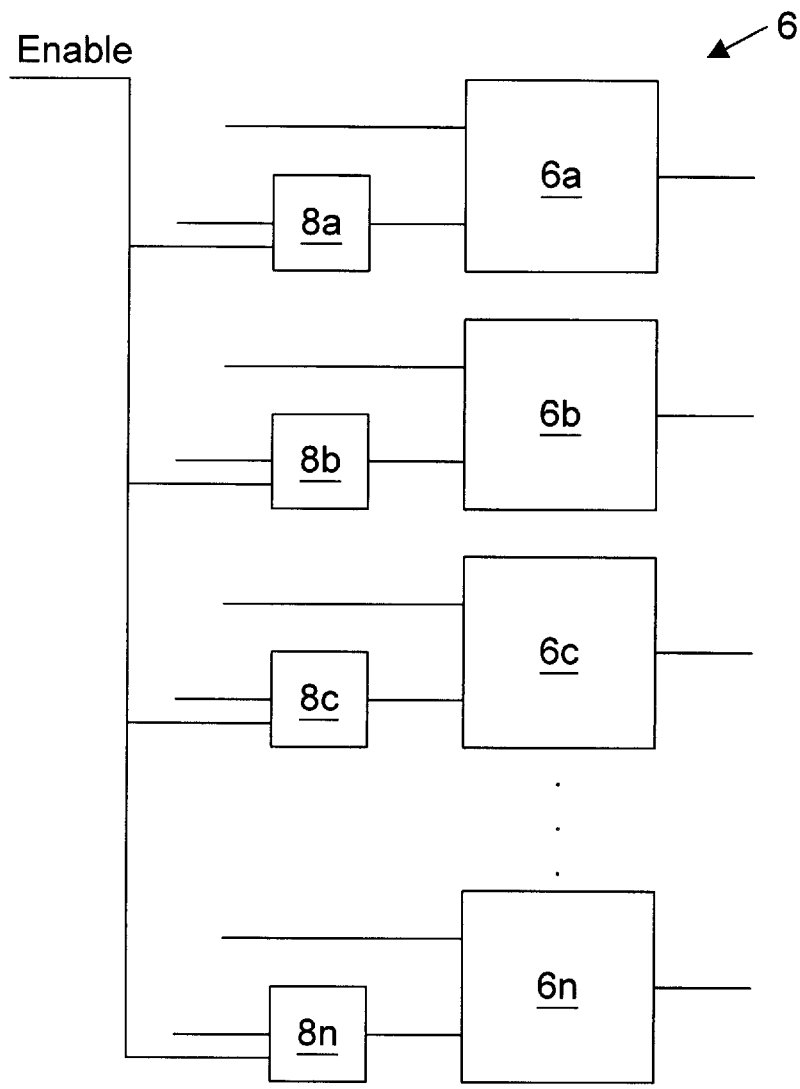

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
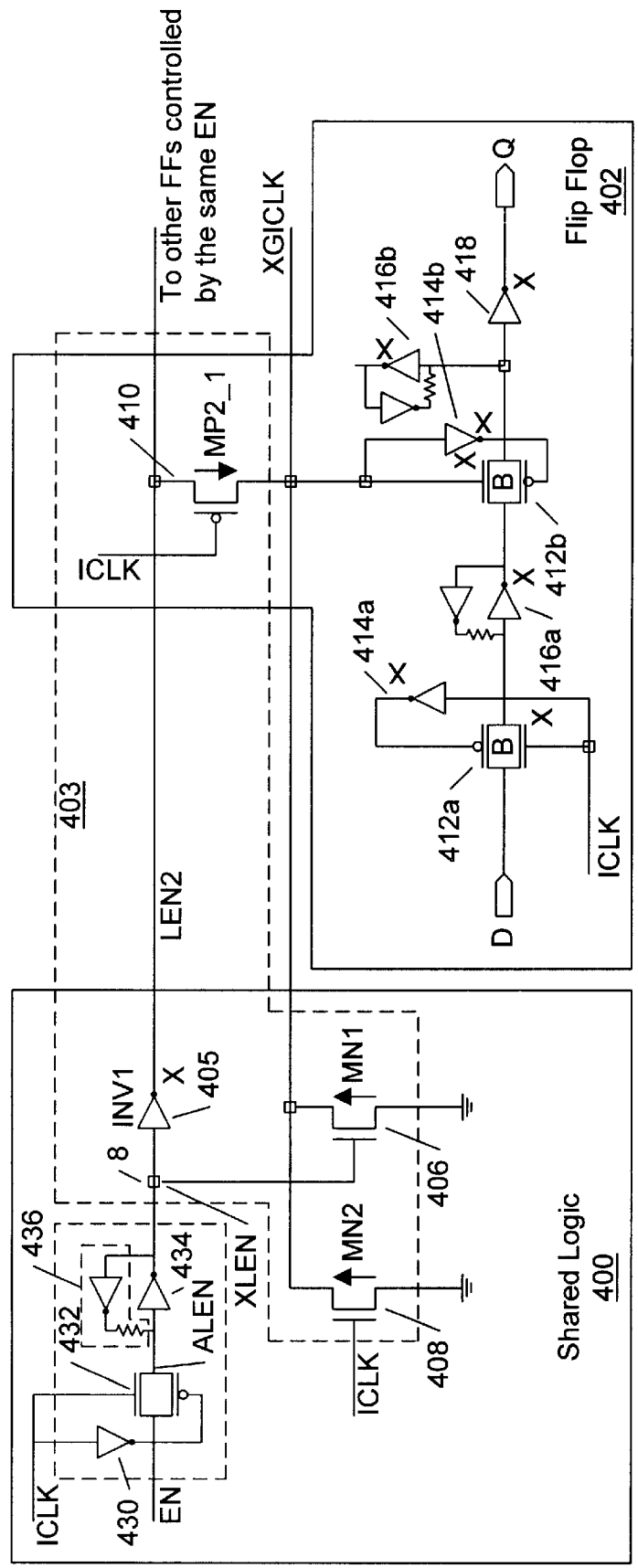
FIG. 4 illustrates a distributed gated clock driver and flip-flop according to one embodiment of the present invention.

FIG. 4—Distributed Gated Clock Driver and Flip-Flop

Turning back to the drawings, and with particular attention to FIG. 4, there is shown a diagram of a distributed gated clock driver and an exemplary flip-flop. It is noted that while only one flip-flop is illustrated, a number of flip-flops equal to the number of bits in the data path are contemplated. In addition, while a D-type flip-flop is shown, other flip-flops, latches, or sequential logic elements are contemplated.

The distributed gated clock driver of FIG. 4 includes a shared logic clock 400 and exemplary flip-flop 402. Shared logic 400 receives as input an enable signal EN and a clock signal ICLK. Clock signal ICLK may be a system clock signal. Clock signal ICLK and its complement are provided to control a transmission gate 432 in a latch 404. When the ICLK signal is logic high, transmission gate 432 is enabled, thereby electrically coupling input signal EN to node A. Inverter 434 drives the output terminal at node B with the complement of the logical value at node A. Inverter 436 is a "trickle" feedback inverter provided to retain the logical value at node A after transmission gate 432 is disabled. Such a trickle inverter is characterized as a "weak" inverter whereby its output may be overpowered by the input signal EN when transmission gate 432 is enabled. The signal XLEN at node B is the logical complement of the input signal EN as long as clock signal ICLK is logic high, and remains the logical complement of the last value of EN when ICLK transitions to logic low.

The output XLEN of latch 404 is provided to inverter 405 as well as to the gate of n-channel transistor 406. The clock signal ICLK is provided to the gate of n-channel transistor 408 in parallel with n-channel transistor 406. An enable signal LEN2 is output from inverter 405. The enable signal LEN2 is provided to each of the flip-flops in the system 402a–402n.

Figure 2:
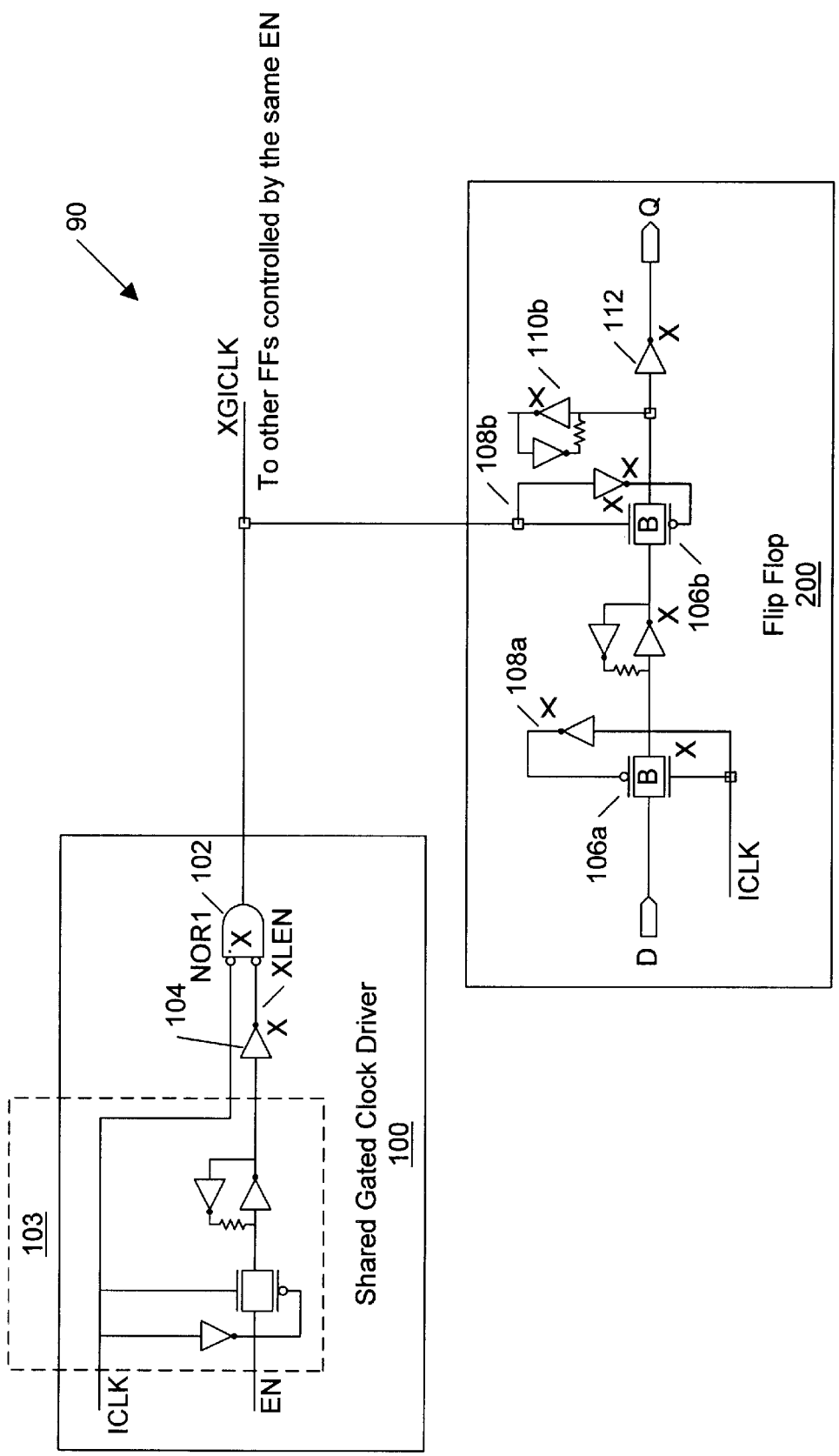
FIG. 2 illustrates an exemplary system employing a shared gated clock driver.

Flip-flop 402 is generally similar to flip-flop 200 of FIG. 2, except that each flip-flop 402 includes p-channel transistor 410. It is noted that n-channel transistors 406 and 408, inverter 405, and p-channel transistor 410 form a modified NOR gate 403 with two outputs. The gated clock signal XGICLK is provided to the flip-flops 402 at the drain of p-channel transistor 410. Since both the enable signal LEN2 and the gated clock signal XGICLK are distributed across each of the flip-flops, and the ICLK signal is directly connected to each flip-flop, clock skew is reduced.

Figure 5:
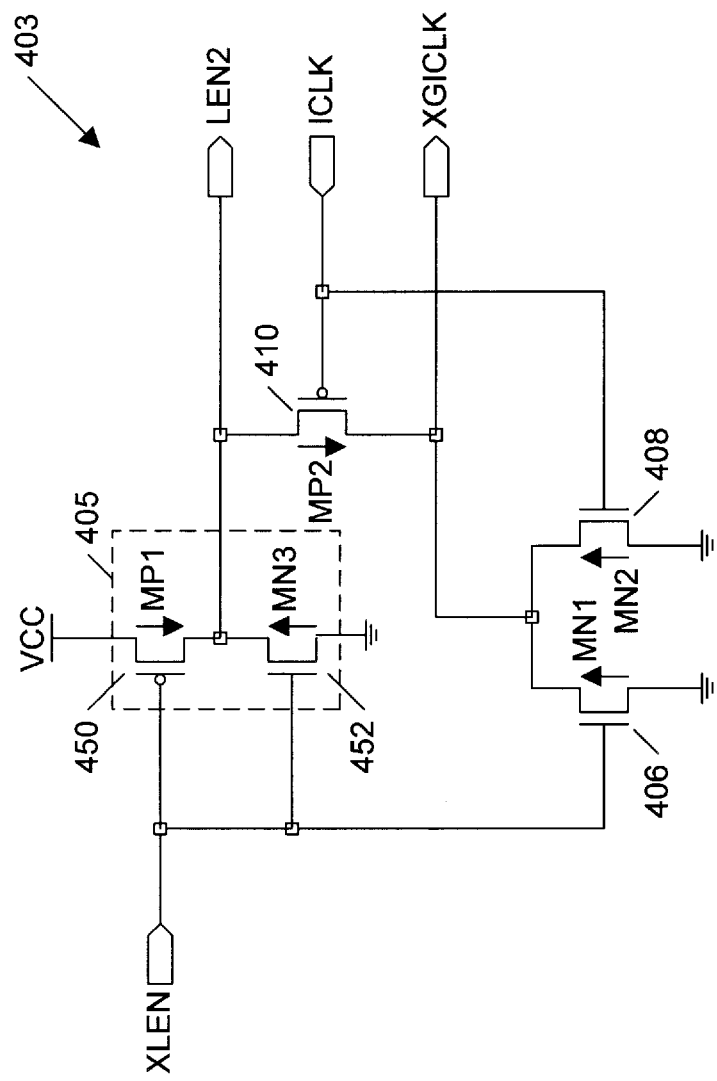
FIG. 5 illustrates a two output NOR gate used in the shared gated clock driver logic of FIG. 4.

FIG. 5—Modified NOR Gate

More particularly, turning now to FIG. 5, there is shown a diagram of modified NOR gate 403. Modified NOR gate 403 includes n-channel transistors 406, 408 connected in parallel. In addition, p-channel transistors 450 and 410 are connected in series. Finally, NOR gate 403 includes n-channel transistor 452. Together, p-channel transistor 450 and n-channel transistor 452 form inverter 405. Thus, when XLEN is high, p-channel transistor 450 is off and n-channel transistor 452 is on. The resulting output LEN2 is low. When XLEN is low, p-channel transistor 450 is on and n-channel transistor 452 is off. The resulting output LEN2 is high.

Figure 3:
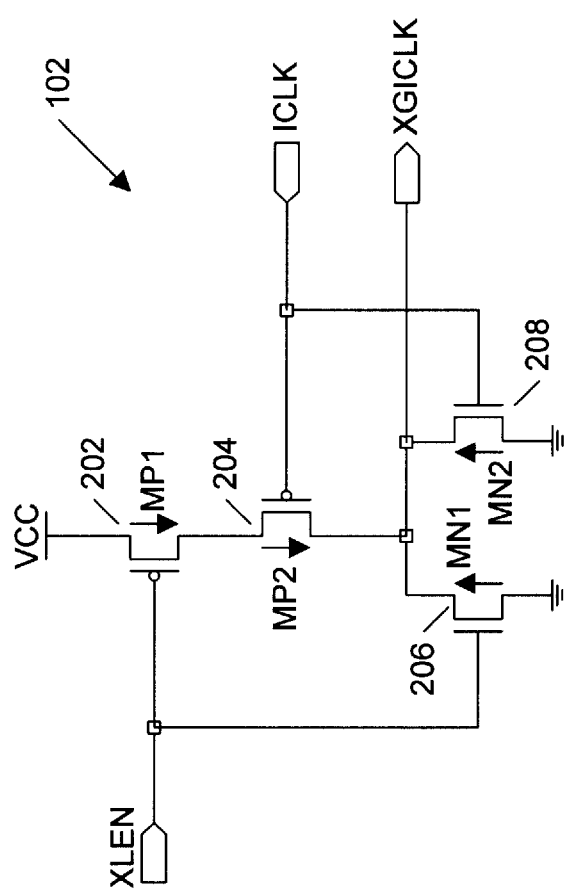
FIG. 3 illustrates a NOR gate used in the shared gated clock driver of FIG. 2.

NOR gate 403 functions in a manner similar to that described above with respect to FIG. 3. Thus, the p-channel transistors 450, 410 function as the pull-up transistors, while the n-channel transistors 406, 408 function as the pull-down transistors. When both inputs XLEN and ICLK are low, both p-channel devices 450, 410 are conducting, while both n-channel devices 406, 408 are cut off, and the output XGICLK is high. When either or both inputs are high, one or both of the p-channel transistors 450, 410 will turn off and one or both of the n-channel transistors 406, 408 will turn on, leading to a low output at XGICLK.

Figure 6:
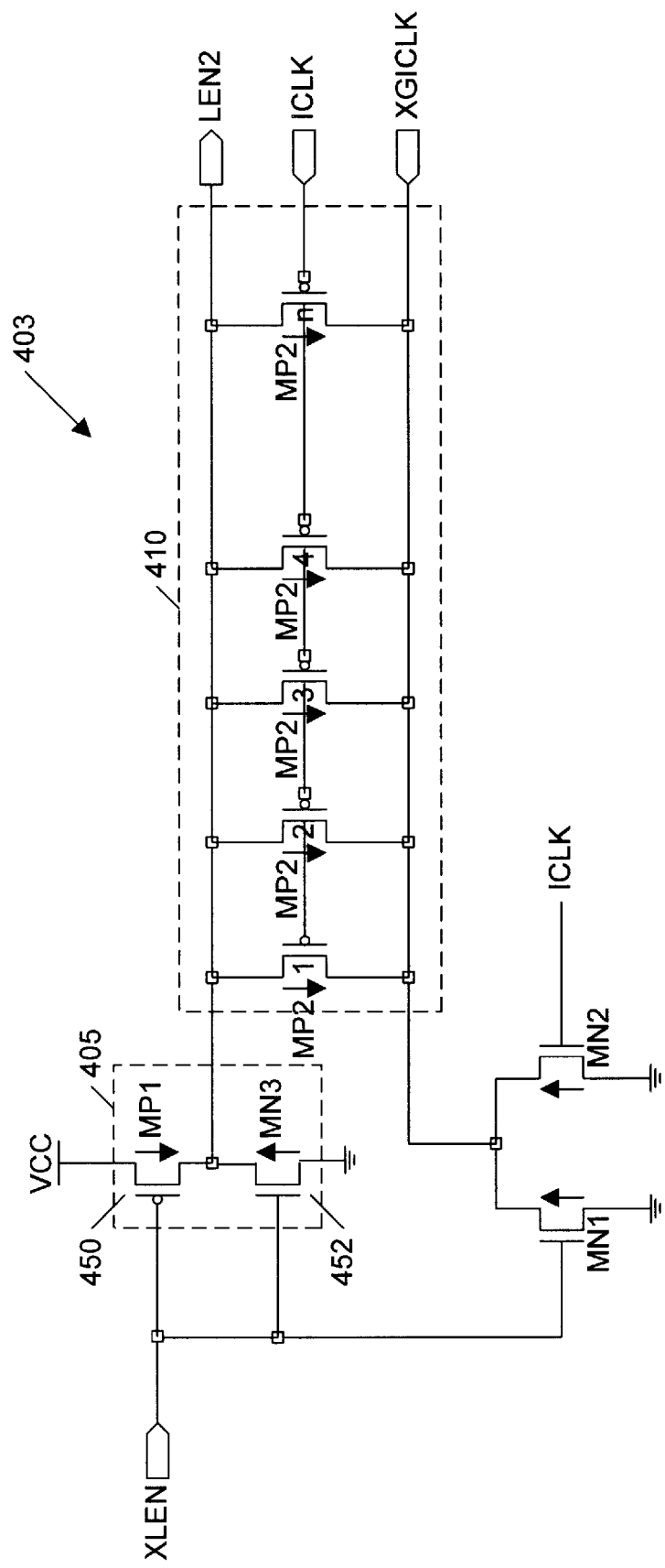
FIG. 6 illustrates the distributed NOR gate of FIG. 4.

FIG. 6—Distributed NOR Gate

As discussed above, the enable signal LEN2 at the output of inverter 405, and the p-channel transistor 410 are distributed to each of the flip-flops in the system, as illustrated in FIG. 4. Thus, a more general illustration of NOR gate 403 may be seen with respect to FIG. 6, which illustrates a distributed NOR gate. P-channel transistors 410a–410n, where n represents the number of flip-flops in the system, are distributed to each of the flip-flops. Thus, the clock drivers, according to the present invention, have shared logic with a distributed NOR gate across each of the flip-flops.

Distributing the p-channel transistors 410a–410n and providing the additional n-channel transistor 452 reduces clock skew because the enable signal occurs prior to the ICLK signal and is propagated to all the data path latches, prior to the falling transition of ICLK. Since ICLK is already distributed to all regions of the chip in a low-skew fashion, the falling edge of ICLK results in a transition of XGICLK with minimal delay compared to the completely shared NOR gate design.

Figure 7:
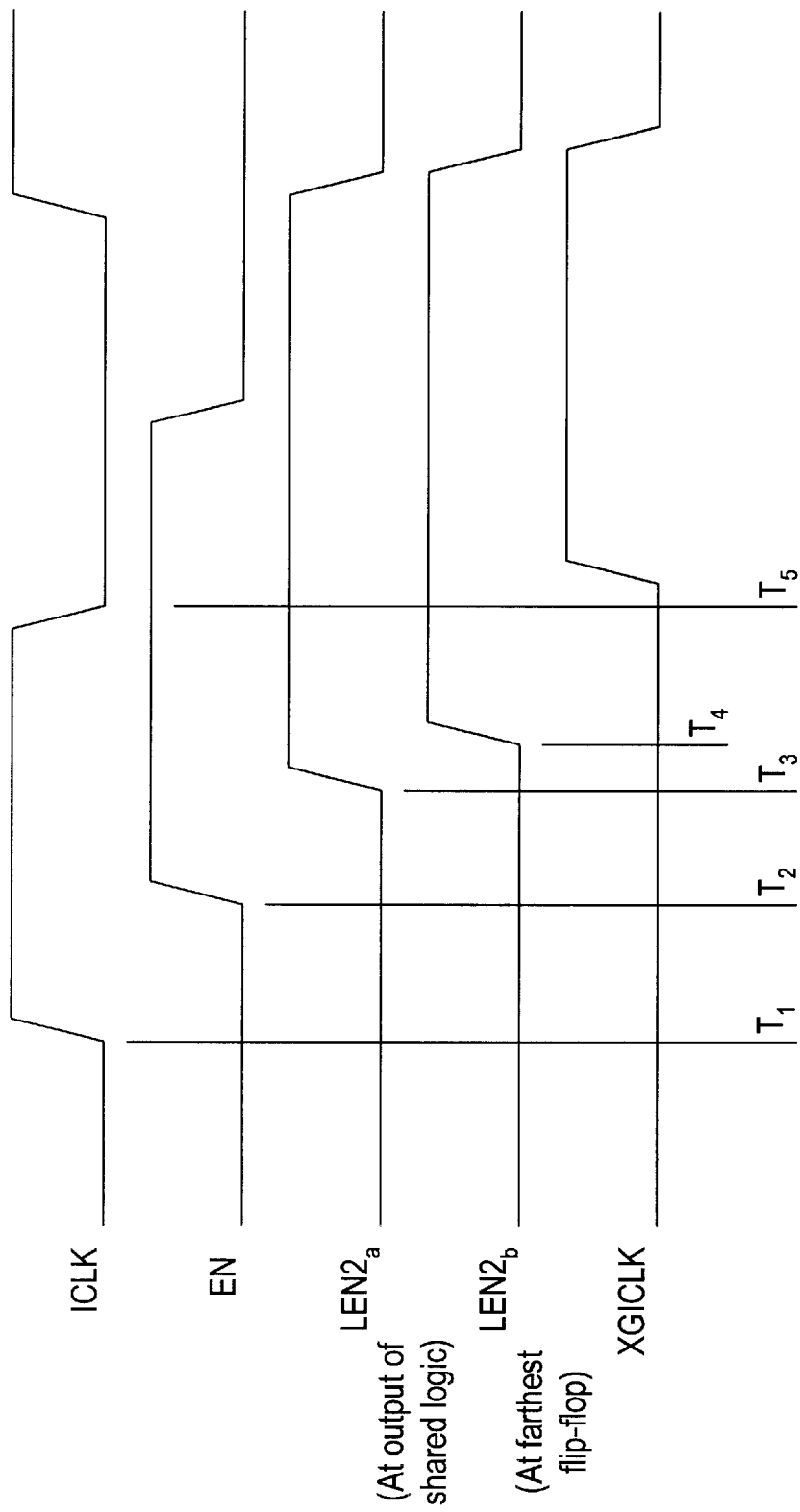
FIG. 7 illustrates a timing diagram of the operation of a distributed gated clock driver with shared flip-flop.

FIG. 7—Timing Diagram

More particularly, operation of the distributed gated clock driver is illustrated in FIG. 7. ICLK is high at time $T_1$. At time $T_2$, the enable signal EN is active. A brief period after, at time $T_3$, the $LEN2_a$ signal goes high. $LEN2_a$ is the LEN2 signal at the output of shared logic 400. $LEN2_b$ goes high a brief time thereafter, at time $T_4$. $LEN2_b$ is the LEN2 signal at the farthest flip-flop. The delay between times $T_3$ and $T_4$ is the result of skew. Finally, at time $T_5$, the ICLK signal goes low, and XGICLK goes high, with minimal skew because the p-channel transistor is positioned close to the flip-flop.

Numerous variations and modifications will become apparent to those skilled in the art once the above disclosure is fully appreciated. It is intended that the following claims be interpreted to embrace all such variations and modifications.

What is claimed is:

1. A gated clock driver, comprising:

an inverter configured to receive a first input signal and including a first n-channel transistor and a first p-channel transistor;

a second n-channel transistor coupled in parallel to a third n-channel transistor, a gate of said second n-channel transistor coupled to receive a second input signal, and said third n-channel transistor coupled to receive said first input signal; and at least one second p-channel transistor having a source coupled to an output of said inverter, a gate coupled to receive said second input signal, and a drain coupled to a drain of said second n-channel transistor and a drain of said third n-channel transistor.

2. A circuit, comprising:

a plurality of sequential logic circuits, each of said plurality of sequential logic circuits including a sequential logic element and including a clock element configured to receive an input enable signal and an input clock signal and configured to provide an output clock signal to clock each of said sequential logic elements; and a shared logic circuit coupled to receive a latch enable signal and said input clock signal, wherein said shared logic circuit is configured to provide said input enable signal to said clock element and is configured to generate said output clock signal with said clock element.

3. The circuit of claim 2, wherein said shared logic circuit comprises a first logic block coupled to receive said latch enable signal and coupled to generate said input enable signal, and a second logic block configured to receive said input clock signal and operably coupled to said first logic block and coupled to an output node of said clock element.

4. The circuit of claim 3, wherein said output node of said clock element is the output clock signal node of said clock element.

5. The circuit of claim 4, wherein said first logic block comprises a first inverter in series with a second inverter.

6. The circuit of claim 5, wherein said second logic block includes a first n-channel transistor having a first gate and coupled at said first gate to a node between said first and second inverters.

7. The circuit of claim 6, wherein said second logic block includes a second n-channel transistor having a second gate and coupled in parallel to said first n-channel transistor and coupled to receive at said second gate said input clock signal.

8. The circuit of claim 7, wherein said clock element comprises a p-channel transistor having a third gate and coupled to receive at said third gate said clock input signal.

9. The circuit of claim 8, wherein a drain of said p-channel transistor, a drain of said first n-channel transistor, and a drain of said second n-channel transistor form a node at which said output clock signal is received.

10. The circuit of claim 9, wherein said output clock signal is a logical NOR of said latch enable signal and said input clock signal.

* * * * *